US009197204B2

(12) United States Patent
Liu

(10) Patent No.: US 9,197,204 B2
(45) Date of Patent: Nov. 24, 2015

(54) DRIVING CIRCUIT, DRIVING METHOD, AND STORING METHOD

(71) Applicant: Raydium Semiconductor Corporation, Hsinchu (TW)

(72) Inventor: Cheng-Chin Liu, Taichung (TW)

(73) Assignee: Raydium Semiconductor Corporation, Hsinchu County (TW)

(*) Notice: Subject to any disclaimer, the term of this patent is extended or adjusted under 35 U.S.C. 154(b) by 353 days.

(21) Appl. No.: 13/741,123

(22) Filed: Jan. 14, 2013

(65) Prior Publication Data

US 2013/0328595 A1 Dec. 12, 2013

(30) Foreign Application Priority Data

Jun. 8, 2012 (TW) .............................. 101120729 A

(51) Int. Cl.
*H03B 1/00* (2006.01)
*H03K 3/00* (2006.01)
*H03K 17/00* (2006.01)
*H03K 19/0175* (2006.01)

(52) U.S. Cl.
CPC ............ *H03K 17/00* (2013.01); *H03K 19/0175* (2013.01)

(58) Field of Classification Search
CPC . G09G 3/3688; G09G 3/3677; G09G 3/3648; G09G 2330/021; H03K 19/00361; H03K 19/00315; H03K 19/0013; H03K 17/00; H04L 25/028; H04L 25/0272; G01R 31/316

USPC ......... 327/108–112, 387, 427, 434, 437, 388, 327/379; 345/204, 100, 211, 51, 53, 98; 326/82, 83, 84–92

See application file for complete search history.

(56) References Cited

U.S. PATENT DOCUMENTS

| 6,049,321 | A | * | 4/2000 | Sasaki .............................. 345/99 |
| 7,403,200 | B2 | * | 7/2008 | Abdoulin ...................... 345/211 |
| 2006/0119596 | A1 | * | 6/2006 | Lin ................................ 345/211 |
| 2006/0227080 | A1 | * | 10/2006 | Huang et al. .................... 345/76 |
| 2009/0015297 | A1 | * | 1/2009 | Chen et al. ..................... 327/108 |
| 2009/0225066 | A1 | * | 9/2009 | Sawahata ....................... 345/211 |
| 2010/0164926 | A1 | * | 7/2010 | Huang et al. .................. 345/211 |

* cited by examiner

*Primary Examiner* — Lincoln Donovan
*Assistant Examiner* — Thomas Skibinski

(57) ABSTRACT

A driving circuit includes at least one output end, at least one driving voltage module, and at least one signal module. The output end receives and outputs an analog voltage. The at least one driving voltage module is connected with the at least one output end and generates a driving voltage, wherein the driving voltage module determines a voltage value of an output voltage according to a relation between an analog voltage and the driving voltage and transmits the output voltage to the at least one output end. The at least one signal module is connected with the at least one output end and outputs an analog data according to the analog voltage, wherein the at least one driving voltage module stores a residual voltage of the at least one signal module when the at least one signal module converts the analog voltage and the analog voltage is larger than the driving voltage.

12 Claims, 9 Drawing Sheets

DRIVING CIRCUIT, DRIVING METHOD, AND STORING METHOD

BACKGROUND OF THE INVENTION

1. Field of the Invention

The present invention relates generally to a driving circuit, a driving method, and a storage method; particularly, the present invention relates to a display driving circuit, a display driving method, and a display storing method which have a judgment mechanism and can save power.

2. Description of the Related Art

In general, displays are widely used in computers, ATMs, TVs, electrical billboards, cellphones, etc. For instance, the types of displays include cold-cathode fluorescent lamps (CCFLs), plasma displays, LCDs, LED displays, or other displays. In practical applications, the LCD has advantages such as light weight, thin dimension, energy saving, low price, etc., and further becomes the most popular display.

Particularly, a conventional LCD has a driving circuit and a panel, wherein the driving circuit drives the panel to display the image. In addition, the panel has a plurality of signal lines, a plurality of gate lines, and a plurality of LC units. The signal lines and the gate lines rotate, based on voltage provided by the driving circuit, the corresponding LC units to display image having different color-level. It is noted that the voltage provided by the driving circuit includes positive voltage and negative voltage to avoid the LC units to be polarized.

It is noted that every time when the panel displays the image, the driving circuit transmits new voltage to the signal lines and the gate lines, further providing the LC units with new rotating angle. In practical applications, the signal lines and the gate lines do not have the function of storing old voltage, so that the driving circuit does not utilize the old voltage for other uses during the discharging process. In other words, the driving circuit is easy to waste power and hard to save energy, not only wasting power, but also increasing the loading of the panel. In general, manufacturers try to utilize the charge-sharing technology to avoid wasting power. However, even if the charge-sharing technology can decrease the waste of power, the goal of saving energy is far from achievable.

In addition, the conventional driving circuit has a system voltage and a driving voltage, wherein the system voltage and the driving voltage have the relation of charge pump. In practical applications, the system voltage generates the voltage 2 or 2.5 times of the driving voltage, and the current of the system voltage is 2 or 2.5 times of the current of the driving voltage. It is noted that the voltage received by the signal lines and the gate lines is generated from the system voltage, so that the system voltage is easy to waste and to increase the loading of the circuit.

For the above reasons, it is an object how to design a display driving circuit for decreasing power consumption and saving power.

SUMMARY OF THE INVENTION

In view of prior art, the present invention provides a driving circuit, a driving method, and a storing method which have a judgment mechanism and can save power effectively.

In view of prior art, the present invention provides a driving circuit, a driving method, and a storing method which have a judgment mechanism and can save power effectively.

It is an object of the present invention to provide a driving circuit which stores a residual voltage to avoid wasting power.

It is an object of the present invention to provide a driving circuit which compares an analog voltage with a driving voltage to determine an output voltage.

The present invention provides a driving circuit including at least one output end, at least one driving voltage module, and at least one signal module. The output end receives and outputs an analog voltage. The at least one driving voltage module is connected with the at least one output end and generates a driving voltage, wherein the driving voltage module determines a voltage value of an output voltage according to a relation between an analog voltage and the driving voltage and transmits the output voltage to the output end. The at least one signal module is connected with the output end and outputs an analog data according to the analog voltage, wherein the at least one driving voltage module stores a residual voltage of the at least one signal module when the at least one signal module converts the analog voltage and the analog voltage is larger than the driving voltage.

It is noted that the driving circuit further includes at least one operating module, wherein each operating module has an input end, the at least one output end is disposed on the at least one operating module opposite to the at least one input end. The analog voltage is transmitted to the at least one operating module from the input end.

In an embodiment, a system voltage drives the at least one driving voltage module to transmit the output voltage to the at least one output end, and the system voltage compensates a voltage of the at least one output end, so that the voltage of the at least one output end is the same as the analog voltage.

Compared to prior arts, the driving circuit of the present invention utilizes the driving circuit module connected with the output end and determines the voltage value of the output voltage according to the relation between the analog voltage and the driving voltage. In practical applications, the driving voltage module is a low power component, so that power can be saved. In addition, when the analog voltage is converted, the driving voltage module can store the residual voltage of the signal module, further recycling the voltage and saving power.

The detailed descriptions and the drawings thereof below provide further understanding about the advantage and the spirit of the present invention. It is an object of the present invention to provide a driving circuit which stores a residual voltage to avoid wasting power.

It is an object of the present invention to provide a driving circuit which compares an analog voltage with a driving voltage to determine an output voltage.

In view of prior art, the present invention provides a driving circuit, a driving method, and a storing method which have a judgment mechanism and can save power effectively.

It is an object of the present invention to provide a driving circuit which stores a residual voltage to avoid wasting power.

It is an object of the present invention to provide a driving circuit which compares an analog voltage with a driving voltage to determine an output voltage.

The present invention provides a driving circuit including at least one output end, at least one driving voltage module, and at least one signal module. The output end receives and outputs an analog voltage. The at least one driving voltage module is connected with the at least one output end and generates a driving voltage, wherein the driving voltage module determines a voltage value of an output voltage according to a relation between an analog voltage and the driving voltage and transmits the output voltage to the output end. The at least one signal module is connected with the output end and outputs an analog data according to the analog voltage, wherein the at least one driving voltage module stores a residual voltage of the at least one signal module when the at least one signal module converts the analog voltage and the analog voltage is larger than the driving voltage.

It is noted that the driving circuit further includes at least one operating module, wherein each operating module has an input end, the at least one output end is disposed on the at least one operating module opposite to the at least one input end. The analog voltage is transmitted to the at least one operating module from the input end.

In an embodiment, a system voltage drives the at least one driving voltage module to transmit the output voltage to the at least one output end, and the system voltage compensates a voltage of the at least one output end, so that the voltage of the at least one output end is the same as the analog voltage.

Compared to prior arts, the driving circuit of the present invention utilizes the driving circuit module connected with the output end and determines the voltage value of the output voltage according to the relation between the analog voltage and the driving voltage. In practical applications, the driving voltage module is a low power component, so that power can be saved. In addition, when the analog voltage is converted, the driving voltage module can store the residual voltage of the signal module, further recycling the voltage and saving power.

The detailed descriptions and the drawings thereof below provide further understanding about the advantage and the spirit of the present invention. The present invention provides a driving circuit including at least one output end, at least one driving voltage module, and at least one signal module. The output end receives and outputs an analog voltage. The at least one driving voltage module is connected with the at least one output end and generates a driving voltage, wherein the driving voltage module determines a voltage value of an output voltage according to a relation between an analog voltage and the driving voltage and transmits the output voltage to the output end. The at least one signal module is connected with the output end and outputs an analog data according to the analog voltage, wherein the at least one driving voltage module stores a residual voltage of the at least one signal module when the at least one signal module converts the analog voltage and the analog voltage is larger than the driving voltage.

In view of prior art, the present invention provides a driving circuit, a driving method, and a storing method which have a judgment mechanism and can save power effectively.

It is an object of the present invention to provide a driving circuit which stores a residual voltage to avoid wasting power.

It is an object of the present invention to provide a driving circuit which compares an analog voltage with a driving voltage to determine an output voltage.

The present invention provides a driving circuit including at least one output end, at least one driving voltage module, and at least one signal module. The output end receives and outputs an analog voltage. The at least one driving voltage module is connected with the at least one output end and generates a driving voltage, wherein the driving voltage module determines a voltage value of an output voltage according to a relation between an analog voltage and the driving voltage and transmits the output voltage to the output end. The at least one signal module is connected with the output end and outputs an analog data according to the analog voltage, wherein the at least one driving voltage module stores a residual voltage of the at least one signal module when the at least one signal module converts the analog voltage and the analog voltage is larger than the driving voltage.

It is noted that the driving circuit further includes at least one operating module, wherein each operating module has an input end, the at least one output end is disposed on the at least one operating module opposite to the at least one input end. The analog voltage is transmitted to the at least one operating module from the input end.

In an embodiment, a system voltage drives the at least one driving voltage module to transmit the output voltage to the at least one output end, and the system voltage compensates a voltage of the at least one output end, so that the voltage of the at least one output end is the same as the analog voltage.

Compared to prior arts, the driving circuit of the present invention utilizes the driving circuit module connected with the output end and determines the voltage value of the output voltage according to the relation between the analog voltage and the driving voltage. In practical applications, the driving voltage module is a low power component, so that power can be saved. In addition, when the analog voltage is converted, the driving voltage module can store the residual voltage of the signal module, further recycling the voltage and saving power.

The detailed descriptions and the drawings thereof below provide further understanding about the advantage and the spirit of the present invention. It is noted that the driving circuit further includes at least one operating module, wherein each operating module has an input end, the at least one output end is disposed on the at least one operating module opposite to the at least one input end. The analog voltage is transmitted to the at least one operating module from the input end.

In an embodiment, a system voltage drives the at least one driving voltage module to transmit the output voltage to the at least one output end, and the system voltage compensates a voltage of the at least one output end, so that the voltage of the at least one output end is the same as the analog voltage.

In view of prior art, the present invention provides a driving circuit, a driving method, and a storing method which have a judgment mechanism and can save power effectively.

It is an object of the present invention to provide a driving circuit which stores a residual voltage to avoid wasting power.

It is an object of the present invention to provide a driving circuit which compares an analog voltage with a driving voltage to determine an output voltage.

The present invention provides a driving circuit including at least one output end, at least one driving voltage module, and at least one signal module. The output end receives and outputs an analog voltage. The at least one driving voltage module is connected with the at least one output end and generates a driving voltage, wherein the driving voltage module determines a voltage value of an output voltage according to a relation between an analog voltage and the driving voltage and transmits the output voltage to the output end. The at least one signal module is connected with the output end and outputs an analog data according to the analog voltage, wherein the at least one driving voltage module stores a residual voltage of the at least one signal module when the at least one signal module converts the analog voltage and the analog voltage is larger than the driving voltage.

It is noted that the driving circuit further includes at least one operating module, wherein each operating module has an input end, the at least one output end is disposed on the at least one operating module opposite to the at least one input end. The analog voltage is transmitted to the at least one operating module from the input end.

In an embodiment, a system voltage drives the at least one driving voltage module to transmit the output voltage to the at least one output end, and the system voltage compensates a voltage of the at least one output end, so that the voltage of the at least one output end is the same as the analog voltage.

Compared to prior arts, the driving circuit of the present invention utilizes the driving circuit module connected with the output end and determines the voltage value of the output voltage according to the relation between the analog voltage and the driving voltage. In practical applications, the driving voltage module is a low power component, so that power can be saved. In addition, when the analog voltage is converted, the driving voltage module can store the residual voltage of the signal module, further recycling the voltage and saving power.

The detailed descriptions and the drawings thereof below provide further understanding about the advantage and the spirit of the present invention. Compared to prior arts, the driving circuit of the present invention utilizes the driving circuit module connected with the output end and determines the voltage value of the output voltage according to the relation between the analog voltage and the driving voltage. In practical applications, the driving voltage module is a low power component, so that power can be saved. In addition, when the analog voltage is converted, the driving voltage module can store the residual voltage of the signal module, further recycling the voltage and saving power.

The detailed descriptions and the drawings thereof below provide further understanding about the advantage and the spirit of the present invention.

DETAILED DESCRIPTION

According to an embodiment of the present invention, a driving circuit is provided for saving power effectively. In the embodiment, the driving circuit can be a driving circuit for LCDs (liquid crystal displays), but not limited to the embodiment.

Figure 1:
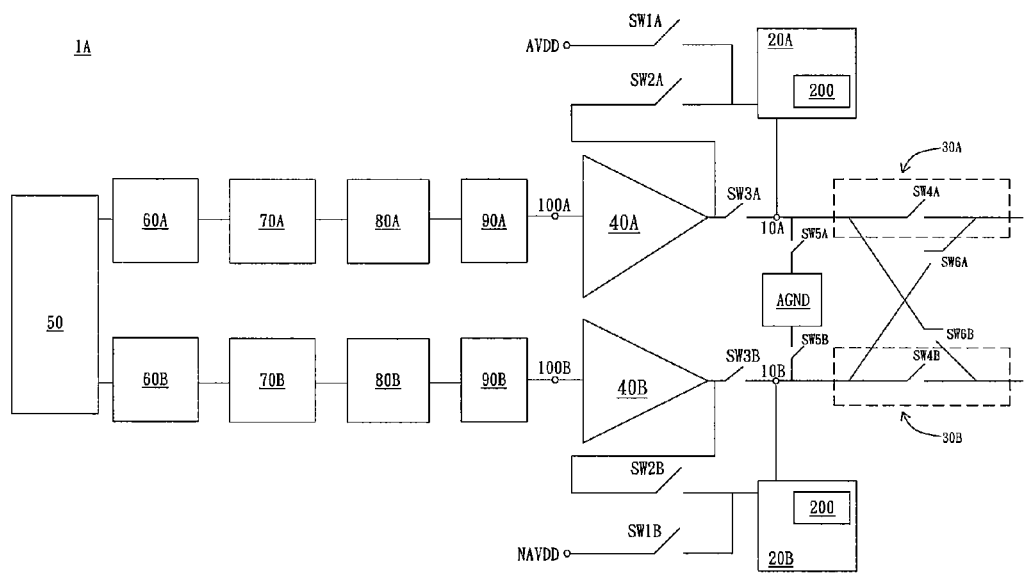
FIG. 1 is a schematic view of an embodiment of the driving circuit of the present invention.

Please refer to FIG. 1; FIG. 1 is a schematic view of an embodiment of the driving circuit 1A of the present invention. As shown in FIG. 1, the driving circuit 1A includes at least one shift register module 50, at least one first stage latch module 60A/60B, at least one second stage latch module 70A/70B, at least one level shifter module 80A/80B, at least one digital/analog converting module 90A/90B, at least one operating module 40A/40B, at least one driving voltage module 20A/20B, at least one signal module 30A/30B, and a plurality of switches SW1A~SW6B. In addition, the first stage latch modules 60A/60B are respectively coupled between the shift register module 50 and the second stage latch modules 70A/70B. The level shifter modules 80A/80B are respectively coupled between the first stage latch modules 60A/60B and the digital/analog converting modules 90A/90B. The operating modules 40A/40B are respectively coupled between the digital/analog converting modules 90A/90B and the driving voltage modules 20A/20B. The signal modules 30A/30B are respectively coupled with the driving voltage modules 20A/20B.

In the embodiment, the driving circuit 1A is used to drive a plurality of display data of the display. Particularly, the driving circuit 1A is a source driving circuit, which can generate and output electrical signals to a plurality of source signal lines, so that the display displays the analog data.

It is noted that the first stage latch module 60A, the second latch module 70A, the level shifter module 80A, the digital/analog converting module 90A, the operating module 40A, the driving voltage module 20A, the signal module 30A, and the switches SW1A/SW2A/SW3A constitute a circuit module. The first stage latch module 60B, the second latch module 70B, the level shifter module 80B, the digital/analog converting module 90B, the operating module 40B, the driving voltage module 20B, the signal module 30B, and the switches SW1B/SW2B/SW3B constitute another circuit module. In practical applications, the shift register module 50 outputs a plurality of positive digital signals and a plurality of negative digital signals respectively to the first latch modules 60A/60B according to a synchronization control signal, wherein the positive digital signals and the negative digital signals have opposite voltage polarities. In other words, the adjacent circuit modules process electrical signals having different voltage polarities, but not limited to the embodiment.

In the embodiment, the first stage latch modules 60A/60B respectively receive the positive digital signals and the negative digital signals. It is noted that the first stage latch modules 60A/60B do not transmit any data to other modules until the first stage latch modules 60A/60B finish receiving the digital data. In addition, after the first stage latch modules 60A/60B finish receiving the digital data, the first stage latch modules 60A/60B transmit the digital data to the second stage latch modules 70A/70B. It is noted that the second stage latch modules 70A/70B and the first stage latch modules 60A/60B have the same function and can temporarily latch the data. In other words, the second stage latch modules 70A/70B and the first stage latch modules 60A/60B can be any type of buffers or latches, but not limited to the embodiment. In other embodiments, the second stage latch modules 70A/70B and the first stage latch modules 60A/60B can be integrated into one latch module according to practical applications, but not limited to the embodiment.

As shown in FIG. 1, the second stage latch modules 70A/70B respectively transmit the digital data to the level shifter modules 80A/80B. Then, the level shifter modules 80A/80B convert the digital data into voltage form receivable by a back-end circuit, and then the converted data is transmitted to the digital/analog converting modules 90A/90B. Subsequently, the digital/analog converting modules 90A/90B convert the digital data into a plurality of analog data to output a plurality of analog voltages.

In practical applications, the operating modules 40A/40B respectively have input ends 100A/100B disposed on the operating modules 40A/40B opposite to the input ends 100A/100B, wherein the output ends 10A/10B function to receive and output the analog voltages. In other words, the input ends 100A/100B and the output ends 10A/10B are oppositely disposed on the operating module 40A/40B, and the analog voltages are transmitted from the input ends 100A/100B into the operating modules 40A/40B.

In addition, the driving voltage modules 20A/20B are connected with the output ends 10A/10B and generate driving voltages, wherein the driving voltage modules 20A/20B determine voltage values of the output voltages according to a relation between the analog voltages and the driving voltages and transmit the output voltages to the output ends 10A/10B.

Figure 2A:
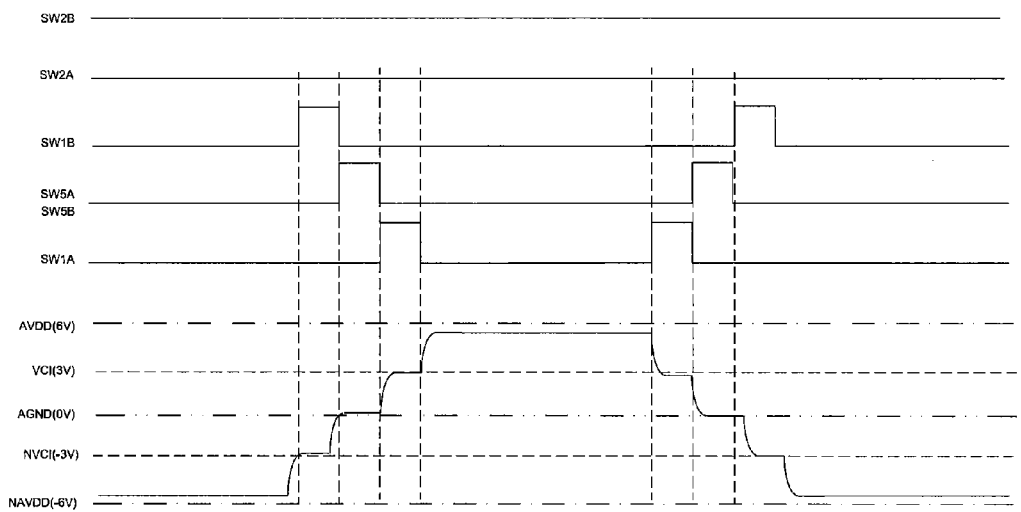
FIG. 2A is a schematic view showing the relation between the high analog voltages and the switches.
Figure 2B:
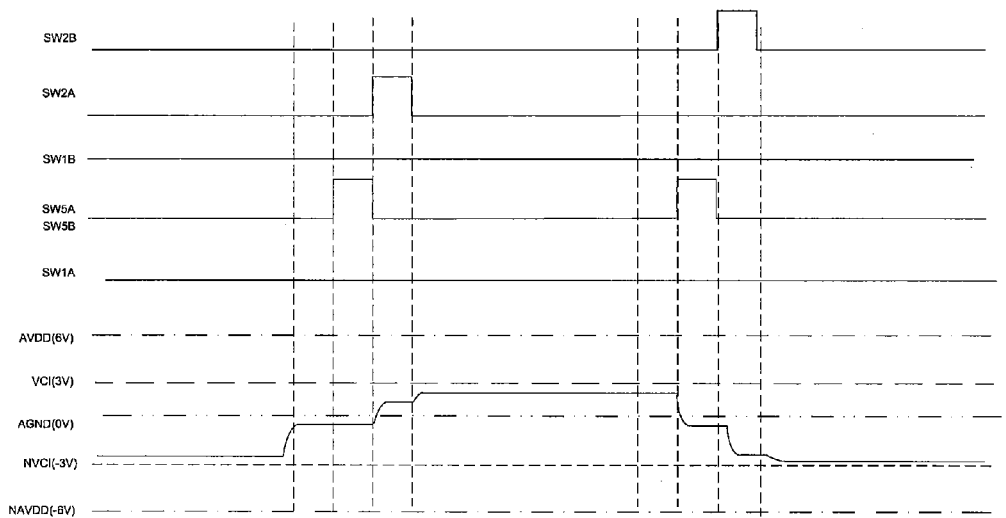
FIG. 2B is a schematic view showing the relation between the low analog voltages and the switches.

For instance, if the operating module 40A processes a positive analog voltage, the corresponding voltage curve is shown in FIG. 2A or 2B. Please refer to FIGS. 2A and 2B; FIG. 2A is a schematic view showing the relation between high analog voltages and the switches; FIG. 2B is a schematic view showing the relation between low analog voltages and the switches. As shown in FIGS. 1 and 2A, AVDD and NAVDD are respectively the positive system voltage and the negative system voltage; VCI and NVCI are respectively the positive driving voltage and the negative driving voltage; AGND is the analog zero potential. It is noted that the positive system voltage AVDD and the negative system voltage are system voltages, and the system voltages are the main power of the operating module 40A for driving the operating module 40A. In addition, the system voltage and the driving voltage have the voltage-multiplying relation which can be achieved by a charge pump. For instance, in the embodiment, the driving voltage and the system voltage have the voltage-double relation. When the positive system voltage AVDD generates current of 1 mA, the positive driving voltage VCI generates current of 2 mA. When the negative system voltage NAVDD generates current of 1 mA, the negative driving voltage NVCI generates current of 2 mA. In addition, the negative driving voltage NVCI and the positive driving voltage VCI have opposite voltage polarities.

It is noted that the driving modules 20A/20B function to generate the driving voltages and transmit the output voltages. In the embodiment, the driving voltage 20A generates the positive driving voltage VCI, and the driving voltage module 20B generates the negative driving voltage NVCI. In practical applications, when the analog voltage is larger than the driving voltage, the voltage value of the output voltage is the same as the voltage value of the driving voltage. When the analog voltage is less than the driving voltage, the driving voltage modules 20A/20B determine the voltage value of the output voltage. It is noted that the driving voltage module performs a comparison of relative amplitude based on an absolute value of the analog voltage and an absolute value of the driving voltage when the analog voltage and the driving voltage are negative voltages.

In the embodiment, the signal modules 30A/30B are connected with the output ends 10A/10B and output the analog data according to the analog voltage. In addition, the signal modules 30A/30B are disposed on a panel (not shown) in the form of signal lines, and the signal module 30A and the adjacent signal module 30B have opposite voltage polarities, but not limited to the embodiment. In other words, if the voltage received by the signal module 30A is the positive voltage, then the voltage received by the signal module 30B is the negative voltage. It is noted that the signal module receives the voltages having different polarity to avoid the corresponding panel components (e.g. LC components) suffering polarization. In the embodiment, the driving circuit 1A can output the analog data to the signal modules 30A or 30B through the activation or deactivation of the switches SW6A and SW6B.

In the beginning, all switches are under a turn-off (deactivated) condition. In the embodiment, the operating module 40A determines whether the received analog voltage is larger than the driving voltage. If the received analog voltage is larger than the driving voltage, the operating module 40A drives the circuit control switches SW1B and SW4B to be activated, so that the negative system voltage NAVDD drives the coupled driving voltage module 20B, and the signal module 30B converts the analog voltage from the internal signal voltage. It is noted that the driving voltage module 20B stores the residual voltage of the signal module 30B when the negative voltage is converted toward zero potential. In ideal conditions, the ideal residual voltage value is ±3V in the embodiment, and the driving voltage module 20B stores the voltage of ±3V.

As shown in FIG. 1, the driving voltage modules 40A/40B include a storage unit 200. In practical applications, the storage unit 200 functions to store the residual voltage, wherein the driving voltage modules 40A/40B compensate the residual voltage and convert the residual voltage into the driving voltage. In the embodiment, the storage unit 200 can be capacitors or other storage components, but not limited to the embodiment. In addition, if the residual voltage is −3V, and the driving voltage of the circuit is ±3V, then the driving voltage module 40B converts the residual voltage into the driving voltage without compensating the residual voltage. However, if the residual voltage is −2.5V, the driving voltage module 40B compensates the residual voltage with −0.5V and converts the residual voltage into a −3V driving voltage.

Please refer to FIG. 2A; the driving circuit 1A controls the switches SW5A/SW5B to be activated, so that the signal module 30A has the voltage of zero potential. In addition, the driving circuit 1A controls the switch SW1A to be activated, so that the positive system voltage AVDD drives the driving voltage module 20A to transmit the positive driving voltage VCI (3V) to the output end 10A. In other words, when the analog voltage is larger than the positive driving voltage VCI, the system AVDD will drive the driving voltage module 20A to transmit the output voltage to the signal module 30A, wherein the voltage value of the output voltage is the same as the positive driving voltage VCI. It is noted that the driving circuit 1A utilizes the positive driving voltage VCI to provide partial voltage value of the analog voltage instead of utilizing the positive system voltage AVDD to provide the voltage value. In other words, compared to the positive system voltage AVDD, the positive driving voltage VCI has lower power consumption, further saving the power.

In practical applications, the positive system voltage AVDD compensates the voltage of the output end 10A, so that the voltage of the output end 10A can be the same as the analog voltage. For instance, if the analog voltage is 5.8V, the positive system voltage AVDD requires to compensate the voltage of 2.8V, so that the analog voltage has the voltage of 5.8V, and the voltage of the output end 10A is the same as the analog voltage. As shown in FIG. 1, the driving circuit 1A controls the switches SW1A, SW2A, SW3A, and SW5A to be activated and controls the switch SW4A to be activated, so that the analog voltage is transmitted to the signal module 30A.

Please refer to FIG. 2A; as the voltage of the voltage curve is decreased from the peak (the analog voltage value), the driving circuit 1A controls the switch SW1A to be activated and controls the switches SW3A, SW4A, and SW5A to be deactivated, so that the positive system voltage AVDD drives the driving voltage module 20A to utilize the storage unit 200 to store the residual voltage of the signal module 30A. In the embodiment, the residual voltage is 2.8V (computed from 5.8V−3V=2.8V). The storage unit 200 can store the residual voltage of 2.8V, and the voltage value provided from the positive driving voltage is replaced by 2.8V at next period. In other words, the driving circuit 1A converts the residual voltage into the driving voltage and decreases the power consumption of the system voltage.

For instance, in conventional driving circuits, the positive system voltage AVDD and the negative system voltage NAVDD respectively utilize the current of 1 mA, and the positive driving voltage VCI and the negative driving voltage NVCI respectively utilize the current of 1 mA. If the power consumption of the system voltage is twice as large as the power consumption of the driving voltage, then the total current $I\_1$ is 6 mA (from 2*1 mA+2*1 mA+1*1 mA+1*1 mA=6 mA). In the embodiment, the positive system voltage AVDD and the negative system voltage NAVDD respectively utilize the current of 1 mA, the residual voltage can compensate the whole driving voltage, and the power consumption of the positive driving voltage VCI and the negative driving voltage NVCI is 0 (computed from 1 mA−1 mA=0), so that the total current $I\_2$ is 4 mA (from 2*1 mA+2*1 mA=4 mA). In other words, the driving circuit 1A of the present invention can save 33.3% (from $(I\_1-I\_2)/I\_1=33.3\%$) of the current. In other embodiments, if the driving voltage and the system voltage have the voltage-multiple relation of 2.5 times, the driving circuit can save 28.5% of the current.

Please refer to FIG. 2A; according to the voltage curve, in the process that the potential of the negative driving voltage NVCI is converted into the potential of the negative system voltage, the driving circuit 1A controls the switch SW1B to be activated, so that the negative system voltage NAVDD drives the drive voltage module 20B to utilize the voltage stored at the period. In other words, when the signal modules 30A/30B convert the analog voltage and the analog voltage is larger than the driving voltage, the driving voltage module 20A/20B not only can store the residual voltage of the signal modules 30A/30B but also can utilize the voltage stored in the storage unit 200 at the period or next period.

As shown in FIG. 2A, when the switch SW1B is driven to be activated at the first time of each period of the voltage curve, the driving voltage module 20B stores the residual voltage. When the switch SW1A is driven to be activated at the first time, the driving voltage module 20A utilizes the voltage stored in previous period. When the switch SW1A is driven to be activated at the second time, the driving voltage module 20A stores the residual voltage. When the switch SW1B is driven to be activated at the second time, the driving voltage module 20B utilizes the voltage stored in the period.

It is noted that the voltage curve shown in FIG. 2A illustrates the condition that the analog voltage is larger than the driving voltage. The present invention further utilizes the voltage curve shown in FIG. 2B to illustrate the condition that the analog voltage is less than the driving voltage. As shown in FIG. 2B, the value of the analog voltage is the peak of the voltage curve and is less than the positive driving voltage VCI.

In practical applications, the driving circuit 1A controls the switches SW5A/SW5B to be activated, so that the signal module 30A has the voltage of zero potential. It is noted that the driving circuit 1A controls the switch SW2A to be activated, so that the positive system voltage AVDD of the operating module 40A drives the driving voltage module 20A to generate the output voltage and to transmit the output voltage to the output end 10A. In other words, the driving voltage module 20A has lower power consumption. The present invention utilizes the driving voltage module 20A to generate the output voltage to provide partial voltage of the output end 10A, further saving the power. In practical applications, the positive system voltage AVDD compensates the voltage of the output end 10A, so that the voltage of the output end 10A is the same as the analog voltage.

In general, the conventional driving circuit converts the system voltage into the analog voltage, wherein the positive system voltage AVDD and the negative system voltage NAVDD respectively utilize the current of 1 mA, and the total current $I\_3$ is 4 mA (computed from 2*1 mA+2*1 mA). It is noted that, in the embodiment, the driving voltage module 20A has a critical activation voltage, so that the positive driving voltage VCI and the negative driving voltage NVCI respectively utilize the current of 0.8 mA, and the positive system voltage AVDD and the negative system voltage NAVDD respectively utilize the current of 0.2 mA, so that the total current $I\_4$ is 2.4 mA (computed from 2*0.2 mA+2*0.2 mA+1*0.8 mA+1*0.8 mA). In other words, the driving circuit 1A of the present invention can save 40% of the current (computed from $(I\_3-I\_4)/I\_3$). In other embodiments, the driving voltage and the system voltage have the voltage-multiple relation of 2.5 times, the driving circuit can save 48% of the current.

Figure 3:
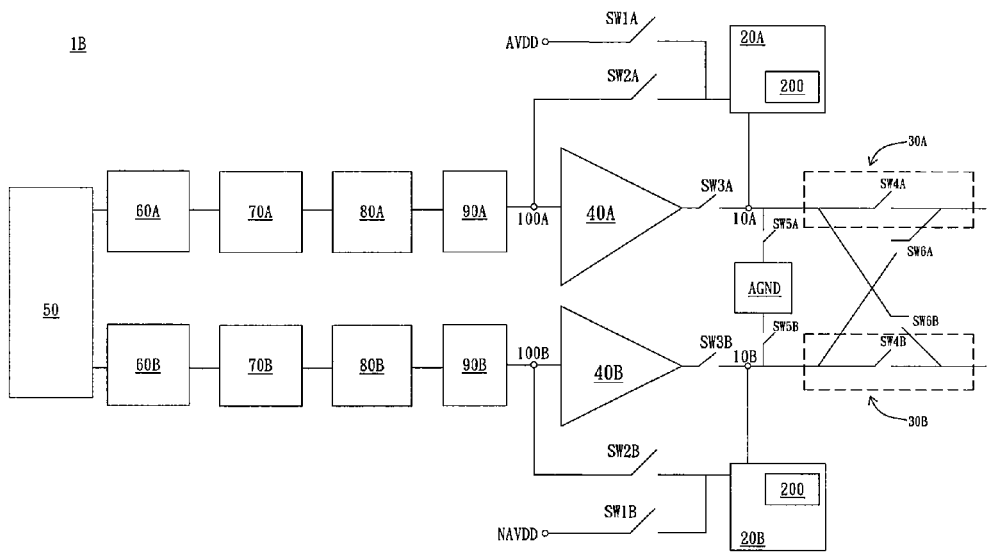
FIG. 3 is a schematic view of another embodiment of the driving circuit of the present invention.

Please refer to FIG. 3; FIG. 3 is a schematic view of an embodiment of the driving circuit in the present invention. As shown in FIG. 3, compared to the driving circuit 1A, the switches SW2A/SW2B of the driving circuit 1B have a different connecting manner. It is noted that the operating modules 40A/40B of the driving circuit 1B can be turned off (in the deactivated condition), and the driving circuit 1B utilizes the input ends 100A/100B to connect with the switches SW2A/SW2B to transmit the voltage to the driving voltage modules 20A/20B. In practical applications, the driving circuit 1B can save more power without driving the operating module with the system voltage, further saving the power. With regard to detailed descriptions of the driving operation of the driving circuit 1B, the driving circuit 1B is essentially the same as the driving circuit 1A and not elaborated hereinafter.

Figure 4:
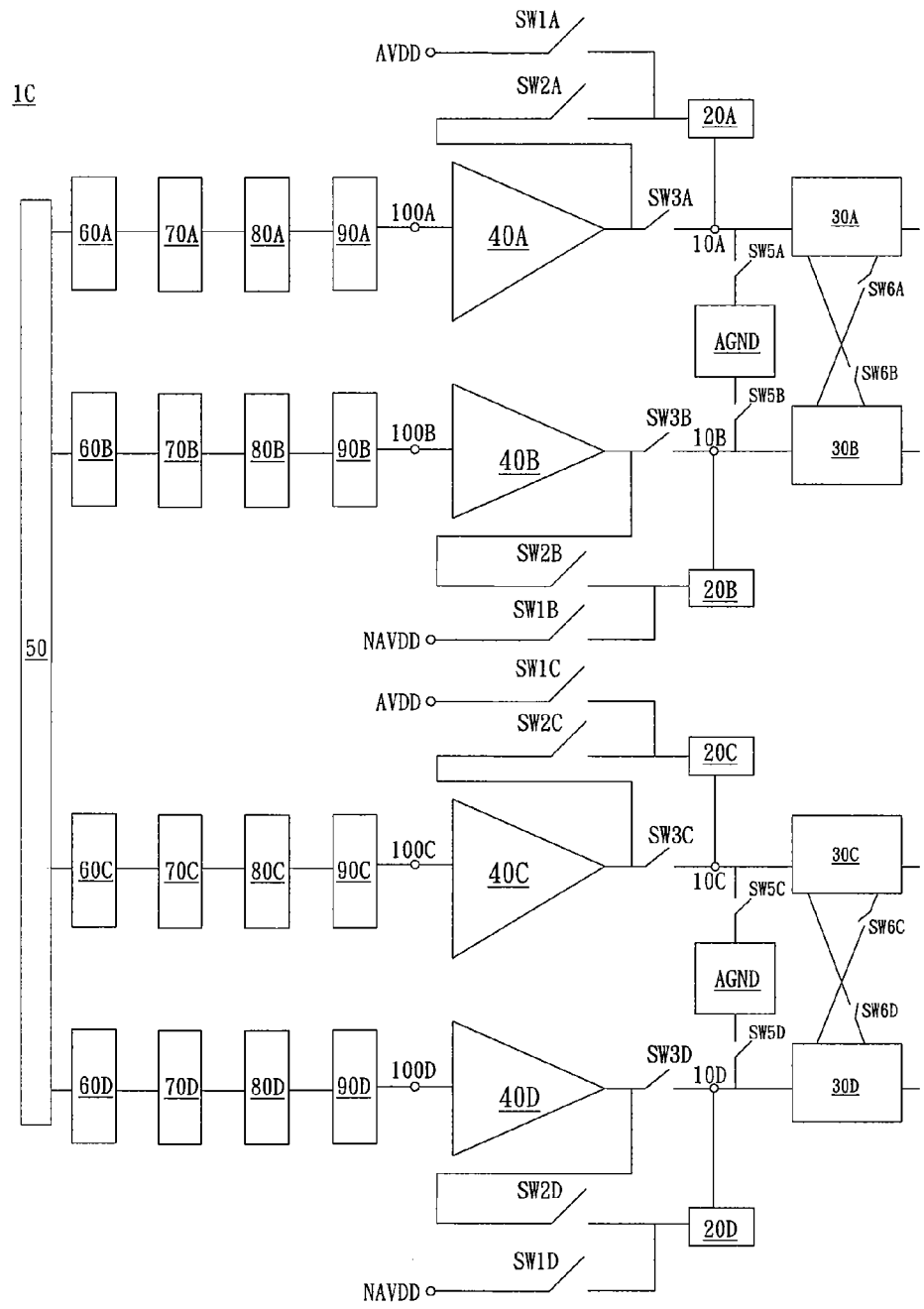
FIG. 4 is a schematic view of another embodiment of the driving circuit of the present invention.

Please refer to FIG. 4; FIG. 4 is a schematic view of an embodiment of the driving circuit in the present invention. As shown in FIG. 4, compared to the driving circuit 1A, the driving circuit 1C further has output ends 10C/10D, driving voltage modules 20C/20D, signal modules 30C/30D, operating modules 40C/40D, first stage latch modules 60C/60D, second stage latch modules 70C/70D, level shifter modules 80C/80D, analog/digital converting modules 90A/90B, input ends 100C/100D, switches SW1C~AW6D, and other circuit modules (as shown within dashed lines). It is noted that, in the embodiment, the driving module 1C has a plurality sets of circuit modules, wherein the circuit modules are disposed in a side-by-side configuration and operate the digital signals. In practical applications, the shift register module 50 outputs the digital signals respectively to the first stage latch modules 60A~60D according to a synchronization control signal, wherein the digital signals include high digital signals and low digital signals. In addition, the high digital signals and low digital signals are respectively converted in to the high analog voltages and the low analog voltages by the digital/analog converting modules 90A~90D, wherein the high analog voltage is larger than the driving voltage, and the low analog voltage is less than the driving voltage. In other words, the output voltages transmitted from the driving voltage modules 20A~20D include high analog voltage and low analog voltage, so that the driving circuit 1C can control the switches according to the high analog voltage and the low analog voltage and in the meantime to decrease the loading of the system voltage, further utilizing proper power-saving operation. With regard to detailed descriptions of the power-saving operation, the driving circuit 1C is essentially the same as the driving circuit 1A and not elaborated hereinafter. Particularly, the driving circuit 1C not only has several channels, but also operates different analog voltages in each channel, to activate or deactivate corresponding switches according to the amplitude of the voltages to save the power.

According to an embodiment of the present invention, a driving method is provided for driving a driving circuit. For instance, the driving method can be used for the driving circuit 1A shown in FIG. 1, the driving circuit 1B of FIG. 3, or the driving circuit 1C of FIG. 4, but not limited to the embodiment.

Figure 5:
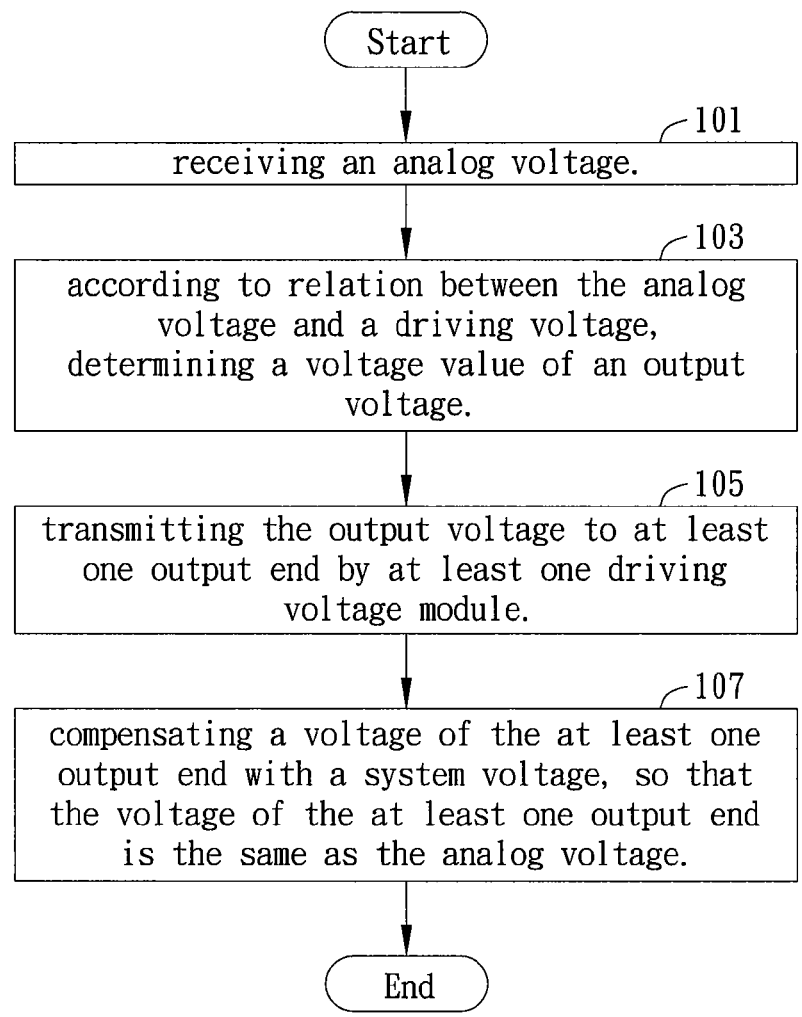
FIG. 5 is a flowchart of an embodiment of the driving method of the present invention.

Please refer to FIG. 5; FIG. 5 is a flowchart of the driving method of the present invention. The driving method includes a step 101 of receiving an analog voltage. As shown in FIG. 1, the input end 100A receives the analog voltage. In addition, the driving method executes, according to relation between the analog voltage and a driving voltage, a step 103 of determining a voltage value of an output voltage. As shown in FIGS. 1 and 2A, the driving voltage module 20A determines the voltage value of the output voltage according to the relation between the analog voltage and the driving voltage. As shown in FIG. 5, the driving method includes a step 105 of transmitting the output voltage to at least one output end by at least one driving voltage module. As shown in FIG. 1, the driving voltage module 20A transmits the output voltage to the output end 10A. In addition, a step 107 involves compensating a voltage of the at least one output end with a system voltage, so that the voltage of the at least one output end is the same as the analog voltage. As shown in FIGS. 1 and 2B, the positive system voltage AVDD compensates the voltage of the output end 10A, so that the voltage of the output end 10A is the same as the analog voltage.

Figure 6:
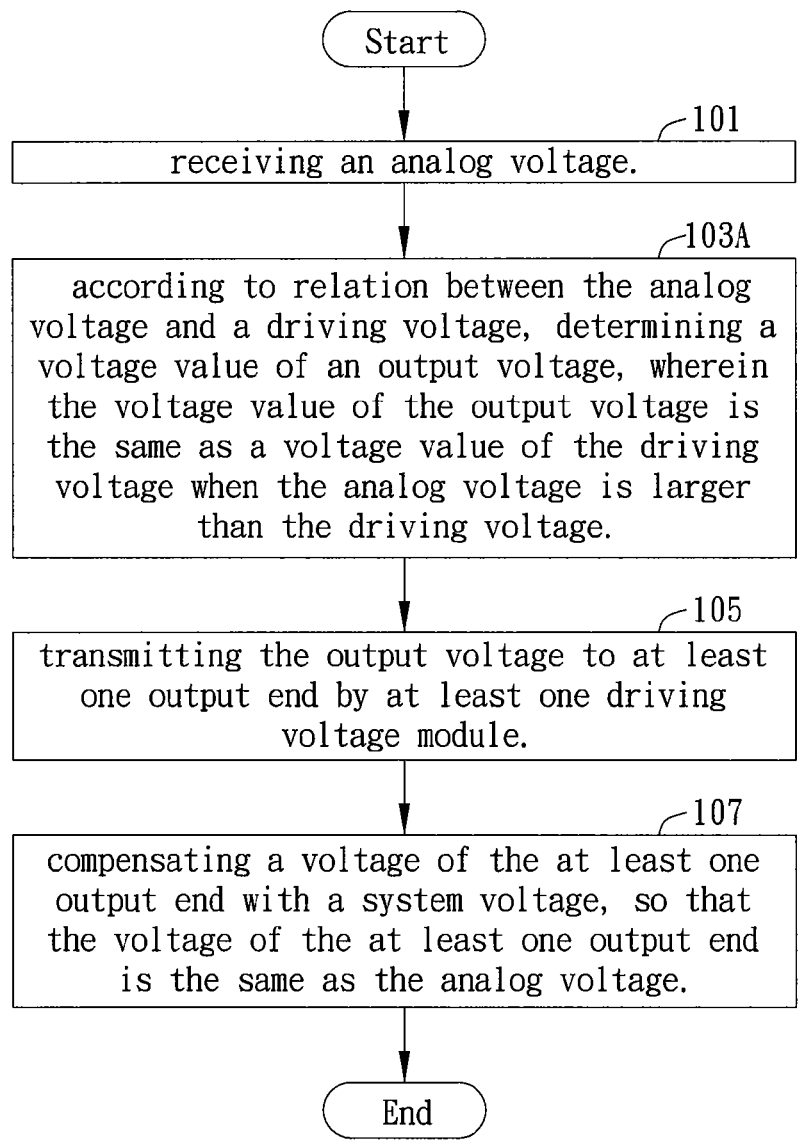
FIG. 6 is a flowchart of another embodiment of the driving method of the present invention.

In addition, please refer to FIG. 6; FIG. 6 is a flowchart of a driving method of the present invention. Compared to the flowchart of FIG. 5, the driving method executes, according to relation between the analog voltage and a driving voltage, a step 103A of determining a voltage value of an output voltage, wherein the voltage value of the output voltage is the same as a voltage value of the driving voltage when the analog voltage is larger than the driving voltage. As shown in FIG. 2A, wherein the output voltage and the driving voltage have the same voltage value.

Figure 7:
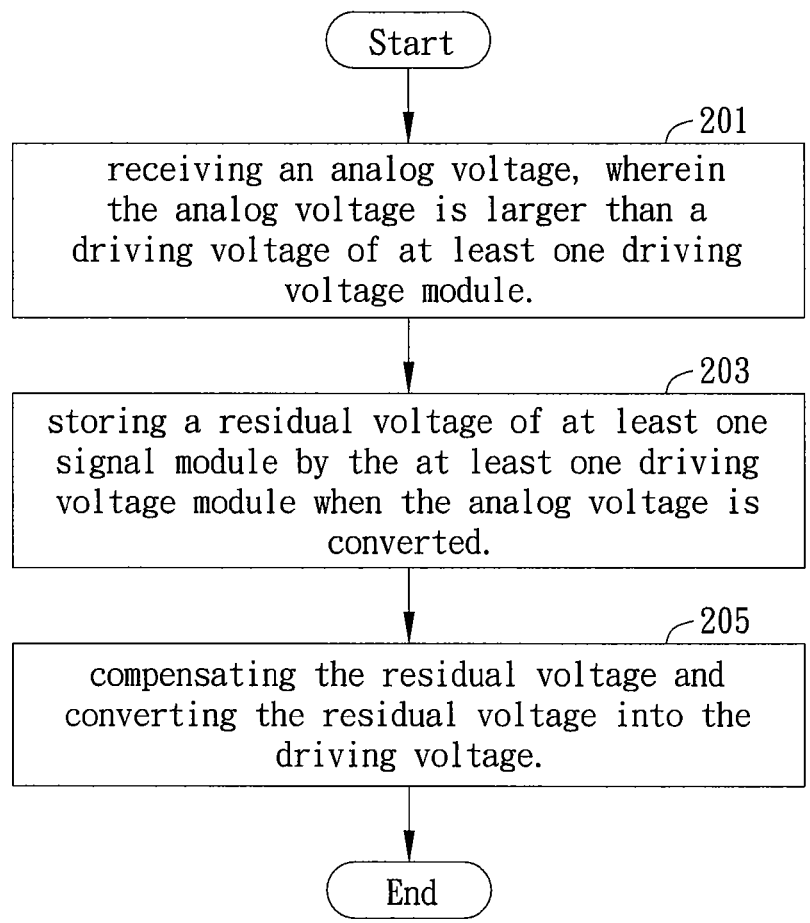
FIG. 7 is a flowchart of an embodiment of storing method of the present invention.

In addition, according to an embodiment of the present invention, a storing method is provided for saving a power of a driving circuit. Please refer to FIG. 7; FIG. 7 is a flowchart of a storing method of the present invention. As shown in FIG. 7, the storing method includes a step 201 of receiving an analog voltage, wherein the analog voltage is larger than a driving voltage of at least one driving voltage module. As shown in FIG. 2A, the system voltage AVDD drives the driving voltage module 20A to transmit the output voltage to the signal module 30A, wherein the voltage value of the output voltage is the same as the voltage value of the positive driving voltage VCI. In other words, the positive driving voltage VCI has lower power consumption, further saving the power.

In addition, the storing method executes a step 203 of storing a residual voltage of at least one signal module by the at least one driving voltage module when the analog voltage is converted. As shown in FIG. 2A, the driving voltage module 20B stores the residual voltage of the signal module 30B when the negative voltage is converted toward zero potential.

As shown in FIG. 7, a step 205 involves compensating the residual voltage and converting the residual voltage into the driving voltage. As shown in FIG. 2A, the driving voltage modules 40A/40B compensate the residual voltage and convert the residual voltage into the driving voltage. In addition, if the residual voltage is −3V, the driving voltage of the circuit is ±3V, so that the driving voltage module 40B converts the residual voltage into the driving voltage without compensating the residual voltage. However, if the residual voltage is −2.5V, the driving voltage module 40B compensates the residual voltage with −0.5V and converts the residual voltage into the driving voltage of −3V.

Figure 8:
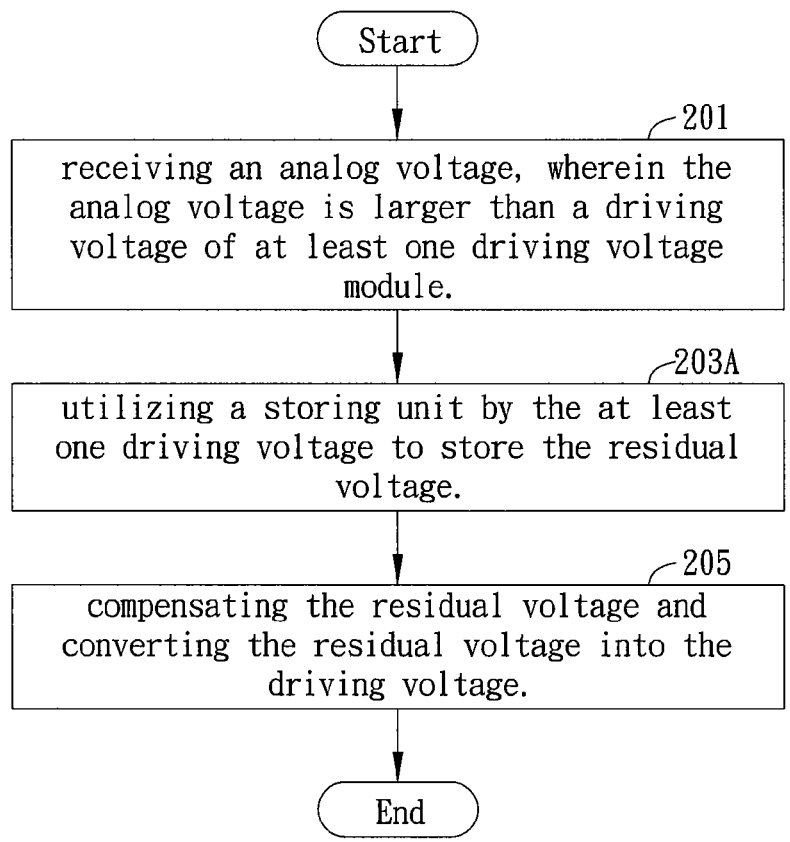
FIG. 8 is a flowchart of another embodiment of the storing method of the present invention.

Please refer to FIG. 8; FIG. 8 is a flowchart of the storing method of the present invention. Compared to the flowchart of FIG. 7, the storing method of FIG. 8 executes a step 203A of utilizing a storing unit by the at least one driving voltage to store the residual voltage. In practical applications, the storage unit 200 is provided for storing the residual voltage and can be capacitors or other storage components, but not limited to the embodiment.

Compared to prior arts, the driving circuit of the present invention utilizes the driving circuit module connected with the output end and determines the voltage value of the output voltage according to the relation between the analog voltage and the driving voltage. In practical applications, the driving voltage module is a low power component, so that power can be saved. In addition, when the analog voltage is converted, the driving voltage module can store the residual voltage of the signal module, further recycling the voltage and saving power.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

The invention claimed is:

1. A driving circuit, comprising:
   at least one output end;
   at least one driving voltage module connected with the at least one output end and generating a driving voltage, wherein the driving voltage module determines a voltage value of an output voltage according to a relation between an analog voltage and the driving voltage and transmits the output voltage to the at least one output end; and
   at least one signal module connected with the at least one output end and outputting an analog data according to the analog voltage, wherein the at least one driving voltage module stores a residual voltage of the at least one signal module when the at least one signal module converts the analog voltage and the analog voltage is larger than the driving voltage;
   wherein the driving voltage provides partial voltage value of the analog voltage.

2. The driving circuit of claim 1, further comprising:
   at least one operating module, wherein each operating module has an input end, the at least one output end is disposed on the at least one operating module opposite to the at least one input end, and the analog voltage is transmitted to the at least one operating module from the input end.

3. The driving circuit of claim 1, wherein a system voltage drives the at least one driving voltage module to transmit the output voltage to the at least one output end, and the system voltage compensates a voltage of the at least one output end, so that the voltage of the at least one output end is the same as the analog voltage.

4. The driving circuit of claim 1, wherein the at least one driving voltage module converts the residual voltage into the driving voltage.

5. The driving circuit of claim 1, wherein the at least one signal module is disposed on a panel in the form of signal line, and adjacent signal modules of the at least one signal module have opposite voltage polarities.

6. The driving circuit of claim 1, wherein the at least one driving voltage module comprises:
a storage unit storing the residual voltage.

7. The driving circuit of claim 1, wherein the output voltage transmitted from the at least one driving voltage module respectively has a high analog voltage and a low analog voltage at the same time.

8. A driving method for driving a driving circuit, comprising:
receiving an analog voltage;
according to relation between the analog voltage and a driving voltage, determining a voltage value of an output voltage; and
at least one driving voltage module transmitting the output voltage to at least one output end;
wherein the driving voltage provides partial voltage value of the analog voltage.

9. The driving method of claim 8, further comprising:
compensating a voltage of the at least one output end with a system voltage, so that the voltage of the at least one output end is the same as the analog voltage.

10. The driving method of claim 8, wherein the voltage value of the output voltage is the same as a voltage value of the driving voltage when the analog voltage is larger than the driving voltage.

11. A storing method for saving a power of a driving circuit, comprising:
receiving an analog voltage, wherein the analog voltage is larger than a driving voltage of at least one driving voltage module; and
the at least one driving voltage module storing a residual voltage of at least one signal module when the analog voltage is converted;
wherein the driving voltage provides partial voltage value of the analog voltage.

12. The storing method of claim 11, further comprising:
the at least one driving voltage utilizing a storing unit to store the residual voltage; and
compensating the residual voltage and converting the residual voltage into the driving voltage.

\* \* \* \* \*